(12) United States Patent
Steinich

(10) Patent No.: US 10,470,328 B2
(45) Date of Patent: Nov. 5, 2019

(54) SENSOR HOUSING

(71) Applicant: ASM Automation Sensorik Messtechnik GmbH, Moosinning (DE)

(72) Inventor: Klaus Manfred Steinich, Zorneding / Pöring (DE)

(73) Assignee: ASM Automation Sensorik Messtechnik GmbH, Moosinning (DE)

( * ) Notice: Subject to any disclaimer, the term of this patent is extended or adjusted under 35 U.S.C. 154(b) by 234 days.

(21) Appl. No.: 15/496,689

(22) Filed: Apr. 25, 2017

(65) Prior Publication Data

US 2017/0311473 A1    Oct. 26, 2017

(30) Foreign Application Priority Data

Apr. 25, 2016 (DE) .................. 10 2016 107 575
Apr. 25, 2016 (DE) .................. 20 2016 102 166 U

(51) Int. Cl.
| | | |
|---|---|---|
| H05K 7/14 | (2006.01) | |
| G01C 9/06 | (2006.01) | |
| G01D 11/24 | (2006.01) | |
| G01L 1/00 | (2006.01) | |
| G08B 5/36 | (2006.01) | |
| G08B 21/18 | (2006.01) | |
| H05K 1/18 | (2006.01) | |
| G01D 11/30 | (2006.01) | |

(52) U.S. Cl.
CPC ............ *H05K 7/1427* (2013.01); *G01C 9/06* (2013.01); *G01D 11/245* (2013.01); *G01D 11/30* (2013.01); *G01L 1/00* (2013.01); *G08B 5/36* (2013.01); *G08B 21/182* (2013.01); *H05K 1/181* (2013.01); *G01C 2009/066* (2013.01); *H05K 2201/10106* (2013.01); *H05K 2201/10151* (2013.01)

(58) Field of Classification Search
CPC ................ H05K 7/1427; H05K 1/181; H05K 2201/10151; H05K 2201/10106; G01C 9/06; G01C 2009/066; G01D 11/30; G01D 11/245; G01L 1/00; G08B 21/82; G08B 5/36
USPC ....................................... 76/862.621
See application file for complete search history.

(56) References Cited

U.S. PATENT DOCUMENTS

| | | | |
|---|---|---|---|
| 725,508 A | | 4/1903 | Thomas |
| 5,233,871 A | * | 8/1993 | Schwarz ............. H05K 5/0047 73/493 |
| 5,233,873 A | * | 8/1993 | Mozgowiec ........... G01P 1/023 73/493 |
| 5,659,950 A | * | 8/1997 | Adams ................... G01P 1/023 257/666 |

(Continued)

FOREIGN PATENT DOCUMENTS

| | | |
|---|---|---|
| DE | 19755765 | 6/1999 |
| DE | 102011087328 | 5/2013 |

(Continued)

*Primary Examiner* — Nathaniel T Woodward
(74) *Attorney, Agent, or Firm* — Head, Johnson, Kachigian & Wilkinson, PC

(57) ABSTRACT

In order to configure a housing (3) for a sensor received in the housing as deformation stable as possible the housing is made integrally in one piece from metal instead of being made from plastic and furthermore the pass through openings (6a, b) for attaching the sensor by bolting to another component are sized and positioned so that impartible forces are not able to deform the housing (3) which has a defined stability.

28 Claims, 5 Drawing Sheets

(56) References Cited

U.S. PATENT DOCUMENTS

| | | | | |
|---|---|---|---|---|
| 5,719,334 | A * | 2/1998 | Parsons | G01P 1/023 |
| | | | | 73/514.01 |
| 5,950,973 | A * | 9/1999 | Verma | B60R 11/00 |
| | | | | 248/222.51 |
| 6,182,508 | B1 * | 2/2001 | Takeuchi | G01C 19/5607 |
| | | | | 310/326 |
| 6,398,252 | B1 * | 6/2002 | Ishikawa | B60R 16/0239 |
| | | | | 280/727 |
| 6,400,044 | B1 * | 6/2002 | Lohberg | B60R 16/0239 |
| | | | | 174/359 |
| 6,519,484 | B1 * | 2/2003 | Lovejoy | A61B 5/14552 |
| | | | | 600/323 |
| 7,098,778 | B1 * | 8/2006 | Zoratti | B60R 21/013 |
| | | | | 280/728.1 |
| 7,819,004 | B2 * | 10/2010 | Steele | B60R 21/01 |
| | | | | 73/493 |
| 9,235,937 | B1 * | 1/2016 | Weinberg | G07C 5/008 |
| 2004/0203500 | A1 * | 10/2004 | Wong | G01L 5/00 |
| | | | | 455/90.3 |
| 2005/0198819 | A1 * | 9/2005 | Hunkeler | H05K 3/284 |
| | | | | 29/841 |
| 2010/0039756 | A1 * | 2/2010 | Steinich | H05K 3/284 |
| | | | | 361/679.01 |

FOREIGN PATENT DOCUMENTS

| | | |
|---|---|---|
| DE | 102015206480 | 10/2016 |
| EP | 1152222 | 11/2001 |
| EP | 1830619 | 2/2007 |

* cited by examiner

SENSOR HOUSING

I. FIELD OF THE INVENTION

The invention relates to a sensor which is advantageously arranged in a flat tub shaped housing, for example an angle sensor or an inclination sensor.

II. BACKGROUND OF THE INVENTION

In sensors of this type the actual sensor element is made from a microchip which is arranged on an electronic circuit board which also carries the rest of the processing circuit of the sensor.

Sensors of this general type typically have two or three bolt openings wherein bolts inserted through the bolt openings facilitate attaching the sensors at an adjacent components whose inclination, rotation, or pivoting shall be measured.

For cost reasons the electronic circuit board in a sensor of this type is typically arranged in a tub shaped plastic housing and typically encased therein by an at least partially curing encasement compound.

The tub shaped plastic housing typically has a flat base side and an open top side extending parallel thereto from which the electronic circuit board is inserted into the recess of the tub shaped housing and encased therein. This open top side can also additionally be closed by a cover placed thereon that is glued down or bolted down.

The problem is that sensors of this type are bolted with their flat side onto a surface that is not completely flat, for example slightly convex or includes small protrusions. This has the consequence that threading the attachment bolts in an tightening them in parts pressure upon the attachment eyelets of the sensor housing in a direction so that a slight warping of the sensor housing can occur since the housing even with subsequent encasement is not stable enough so that forces imparted by the bolting do not cause any deformation.

This almost always applies for a plastic housing and even for a housing made from metal like e.g. aluminum the deformation is a function of the housing dimension. Certainly a height and wall thickness of an aluminum housing of this type can be selected so that the attachment forces do not cause any deformation however there is also a requirement that sensors of this type are additionally be configured as small and light as possible.

When the tub shaped housing deforms this transfers from there onto the at least partially cured encasement compound and from there again to the electronic circuit board and especially the chip which represents the actual sensor element.

However it has been found that an electronic chip of this type is very sensitive also with respect to a very small mechanical loads and also for an only very slightly deformed housing of the sensor measuring results of the sensor are highly distorted.

III. DETAILED DESCRIPTION OF THE INVENTION

Technical Object

Thus, it is an object of the invention to provide a sensor which does not expose a sensor element arranged in the sensor, typically a micro-chip to a mechanical load due to a deformation of the sensor housing when the sensor is bolted to an uneven surface.

Solution

The object is achieved by the features of claims 1 and 7. Advantageous embodiments can be derived from the dependent claims.

For starters according to the instant invention an uneven bottom side of the pot shaped housing which is arranged opposite to the open side is defined as a main plane and the direction orthogonal thereto is designated as axial direction or vertical.

Furthermore as matter of principle two different embodiments of a sensor of this type have to be differentiated with respect to the configuration of the housing.

In the first embodiment the attachment eyelets provided for bolting to an environment are configured integral in one piece together with the rest of the housing, thus in particular the tub shaped housing body.

In this embodiment the object is achieved in that the pass through openings provided in the attachment eyelets of the sensor for bolting the sensor down are limited in their cross section so that no forces can be imparted into the housing that are high enough to deform the housing even on an uneven surface when the housing is attached at the surface by bolts that are fit through the pass through openings and are being tightened.

Additionally the tub shaped housing is configured as stable as possible while still being small and compact advantageously in that at least the tub shaped housing body, advantageously the entire housing besides a cover that may be additionally provided is made from metal and not from plastic material so that it can bear much higher loads already due to its material. Due to the material selection and also due to the in particular integral configuration of the housing the housing is particularly stable.

In a first variant of this first embodiment the attachment eyelets have the same thickness transversal to a main plane of the housing or approximately the same thickness as the tub shaped housing body. This provides that the attachment eyelets typically protruding from the tub shaped housing cannot be bent relative to a rest of the tub shaped housing, in particular in that a thickness of the attachment eyelets is more than 60% better more than 80% better than 90% or ideally 100% of a thickness of circumferential side walls of the housing.

In a second variant of the first embodiment the attachment eyelets are configured rather thin compared to the tub shaped housing body in the transversal direction to the main plane, namely less than 50%, better less than 40%, better than 30%, better less than 20%, better less than 10% of the thickness of the housing body.

Thus, attachment bolts can bend relative to the tub shaped housing body during bolting down but the housing body itself does not bend.

It is a disadvantage that the attachment eyelets can break off from the tub shaped housing body when they are bent too much.

In a second embodiment the housing in addition to the tub shaped housing body includes a separate fixation element attached thereto in which the pass through openings are arranged for bolting the housing to an adjacent component, advantageously outside of the plane form of the tub shaped housing body in top view.

Also here the effect is that the attachment bolts of the separate fixation element can bend relative to the tub shaped housing body during bolting down, but the housing body itself does not bend.

In all three embodiments and variants an additional optimization effect can be achieved by essentially the same measures.

The circumferential side walls will advantageously have the same height everywhere so that a parallel flat front side of the housing is created in addition to the even base side.

Thus advantageously the side walls are arranged orthogonal to the base surface since this further reduces a deformation of the side walls relative to slanted side walls which are in particular inevitable when the tub shaped housings are made by plastic injection molding.

In a top view of the main plane from the open front side the recess into which the electronic circuit board is inserted has a non-circular contour and advantageously also the electronic circuit board inserted there in has at least partially the same non-circular contour and contacts insides of the side walls of the recess at a circumference at least at 3 points and is fixated in a form locking manner in a direction of the main plane and simultaneously received in the recess so that it is not rotate able.

Thus the electronic circuit board has a distance from inside of the side walls at least at two spots on the circumference so that during encasing of the electronic circuit board in the recess the encasement compound can flow under the circuit board on a first side and the displaced air can escape on a second side through the other gap.

A widest portion of the recess is typically arranged between the pass through openings for the recess or at least proximal to the pass through openings wherein advantageously only 2 pass through openings are provided that are arranged opposite to one another.

Advantageously, the recess has a keyhole shaped contour in top view wherein a protrusion extends from the widest portion, the central portion. With this configuration and an analogously configured electronic circuit board the sensor chip and the processing circuit can be arranged in a wider central portion whereas the narrower protrusion portion is used in particular for feeding a cable to the electronic circuit board and soldering its strands to respective soldering pads or other attachment devices for strands at the electronic circuit board.

Therefore advantageously the face side wall of the protrusion portion includes a cable pass through opening for passing through a cable, advantageously with an internal thread into which the cable is threaded with its jacket so that a pull relief is provided for the cable.

Then the electronic circuit board does not reach the face end of the protrusion portion but terminates before in order to facilitate fanning the strands of the cable in this free space.

However, a new option is not to encase the electronic circuit board inserted into the recess of the tub shaped housing but to encase it in a mold before being inserted into the housing so that a form stable encasement element is provided, wherein however the encasement compound is selected so that it is still elastic within limits in a completely cured condition. This encasement element is also inserted into the recess of the housing, however only after curing and fits into the housing but the encasement element only contacts inner surfaces of the side wall with a few protrusions that are oriented outward from the encasement element which renders a force transfer from the housing to the encasement element much more difficult since these elastic protrusions with small surfaces would be deformed first.

When encased in the housing the electronic circuit board contacts a base of the housing either with electronic components arranged at the bottom side of the electronic circuit board and protruding from the electronic circuit board or on special contact surfaces for the electronic circuit board protruding in the housing from the base.

The electronic circuit board arranged in the housing that is encased therein or inserted as an encasement element can be further protected in that the open front surface of the housing is close able tight by an applied, glued down or bolted down cover which however is typically not necessary when the encasement material is substantially cured and encasement it performed in the tub shaped housing. Instead the finished sensor is arranged during mounting with its open front surface so that the sensor is oriented towards the surface where it is to be attached.

A wall thickness of the face wall of the protrusion portion is thus selected significantly larger, at least larger by a factor of 1.5, better at least by a factor of 2, than a wall thickness of the adjacent side walls that are arranged at an angle to the face wall. This is used in particular for being able to provide a sufficient sealing length to a cable that is being passed through and/or to provide a sufficiently long thread for the pull relief by the thread.

The side walls should not undercut a minimum wall thickness anywhere and also a distance between the recess and pass through openings arranged outside of the recess and not in connection with the recess should be greater than the minimum wall thickness wherein the pass through openings are used for bolting.

The minimum wall thickness of the housing or of the housing body is advantageously at least 10%, better at least 15% of a height of the side walls measured including the thickness of the base adjoining the side surface.

Since the loading of the housing through the bolting is not only a function of a force introduced at the individual bolting location but also a function of a size of the lever arm through which the bolting impacts the housing, attention has to be paid to a distance of the pass through openings.

Thus, a height of the side walls should be at least 12%, better at least 16%, better at least 20% of a distance between 2 pass through openings that are the farthest away from each other measured from their center point to their center point so that a height of the side walls grows in analogy to a distance of the bolting openings.

A thickness of the base should correspond at the most to a minimum wall thickness of the side walls since the base puts up little resistance against a bending transversal to the main plane.

Another measure is to keep a mutual distance of the pass through openings for the bolting as small as possible. Thus the pass through openings can be arranged in a cost effective manner since are implemented with low material requirement, for example in a transition portion between the widest portion and the protrusion portion of the recess, e.g. a key hole shaped recess wherein the pass through openings are arranged outside of the recess.

Advantageously the pass through openings are arranged opposite to each other in a portion of the smallest width of the recess.

Typically the recess as well as the outer contour of the housing in top view is configured lateral symmetrical, thus mirror symmetrical to the plane of symmetry that extends in a direction of the longest extension of the recess orthogonal to the main plane.

EMBODIMENTS

Embodiments of the invention are subsequently described in more detail with reference to drawing figures, wherein:

FIG. 1a, b illustrates the housing in a first embodiment in top view and in a longitudinal sectional view;

Figure 1A:
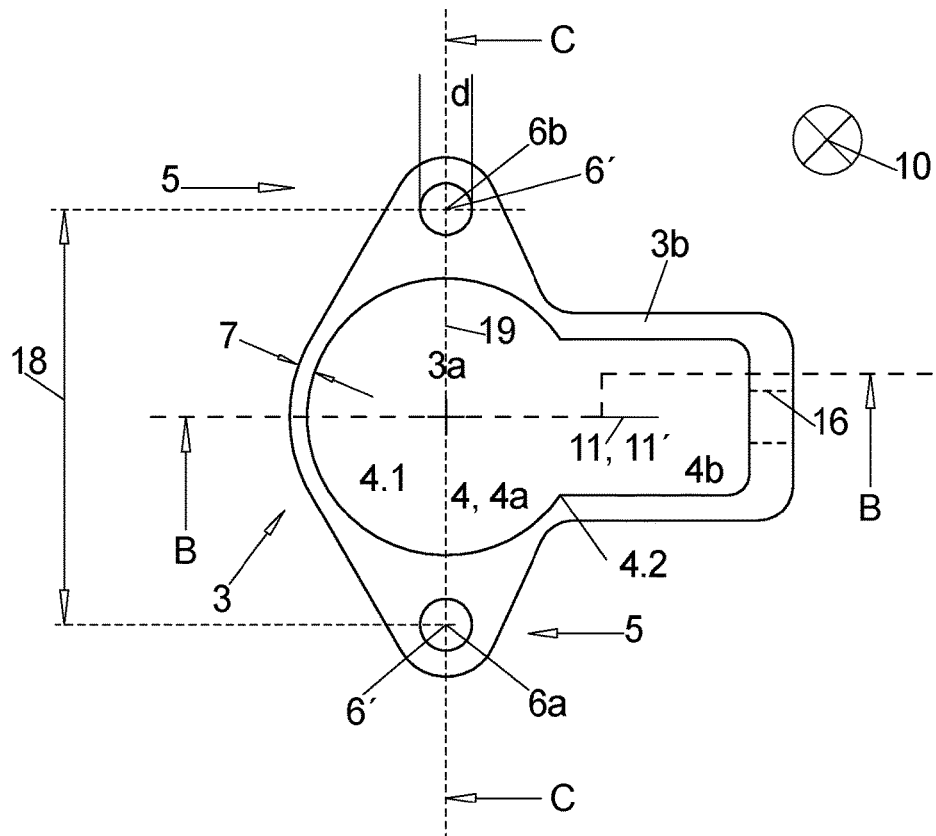
FIG. 1c illustrates the housing in a first embodiment in a cross sectional view.
FIG. 1d illustrates the housing in a third embodiment in a cross sectional view.
Figure 2A:
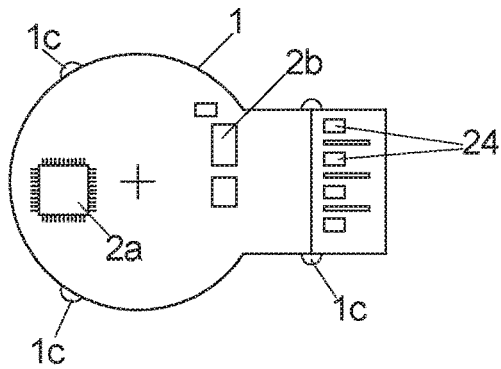
Figure 2B:
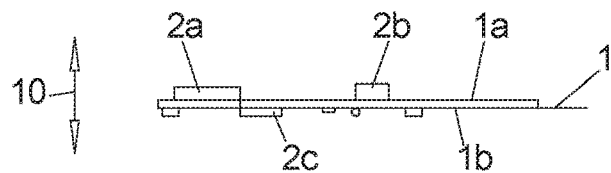
Figure 3A:
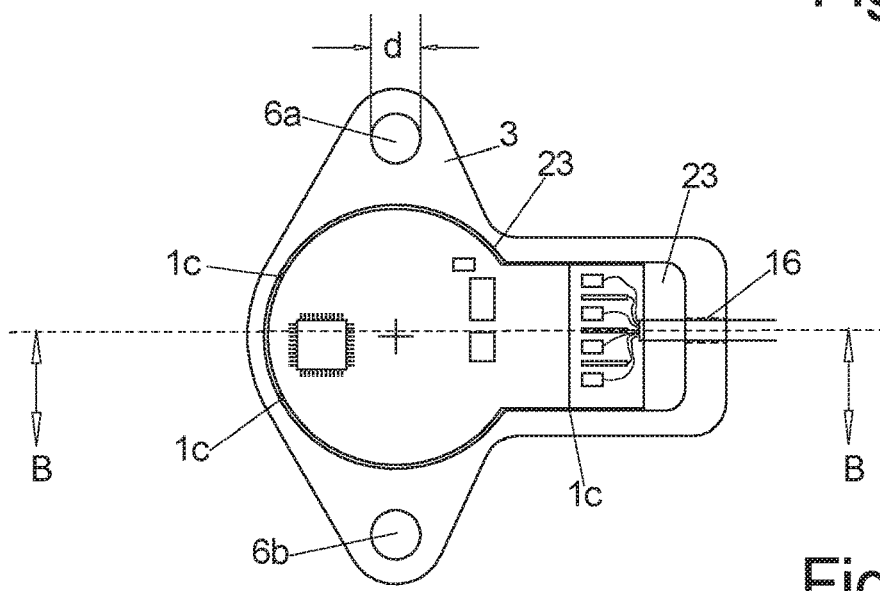
Figure 3B:
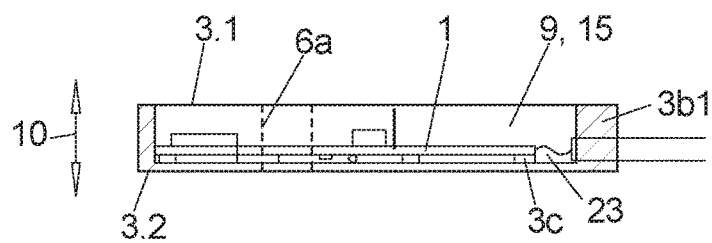
Figure 4:
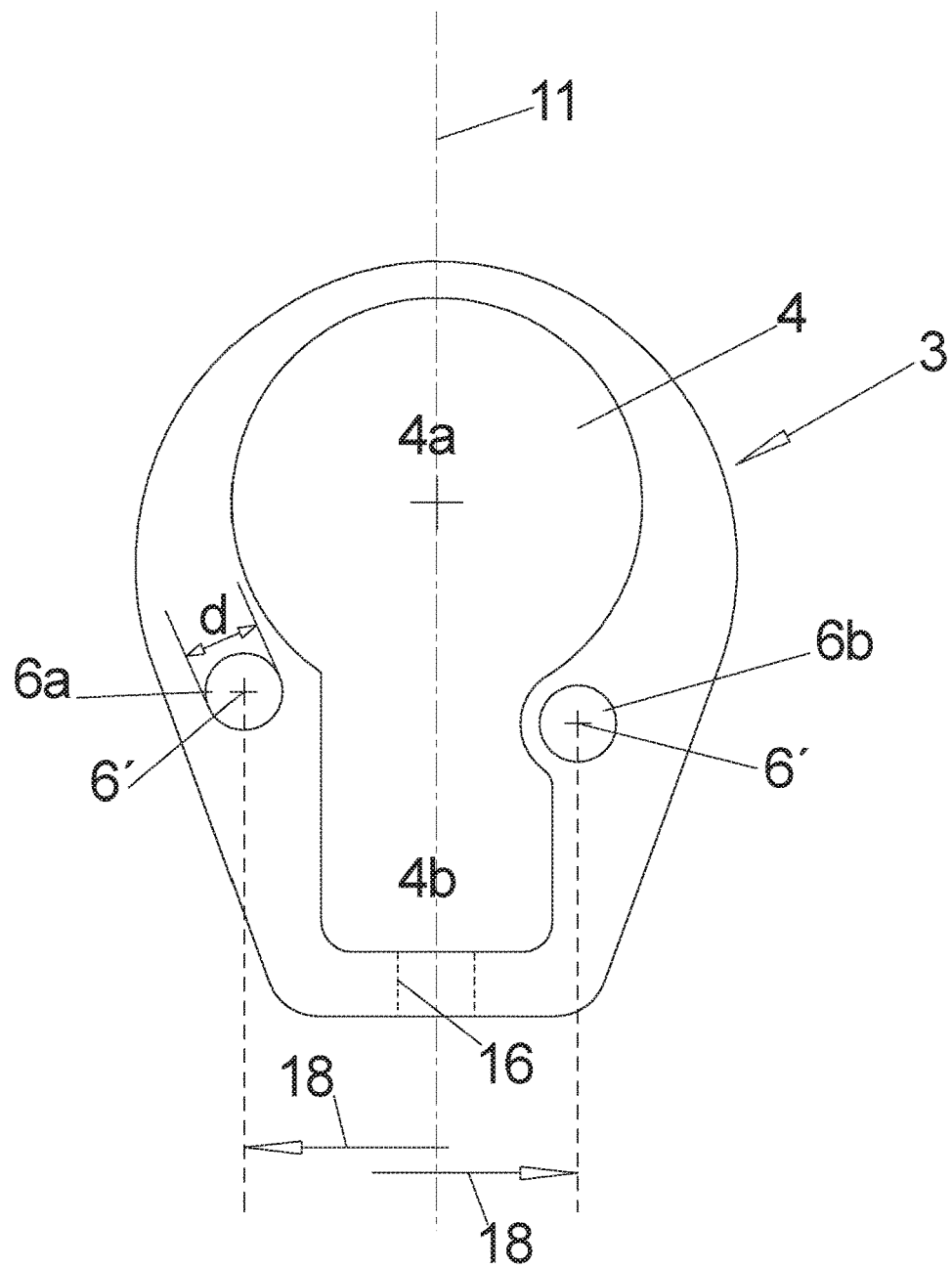
Figure 5A:
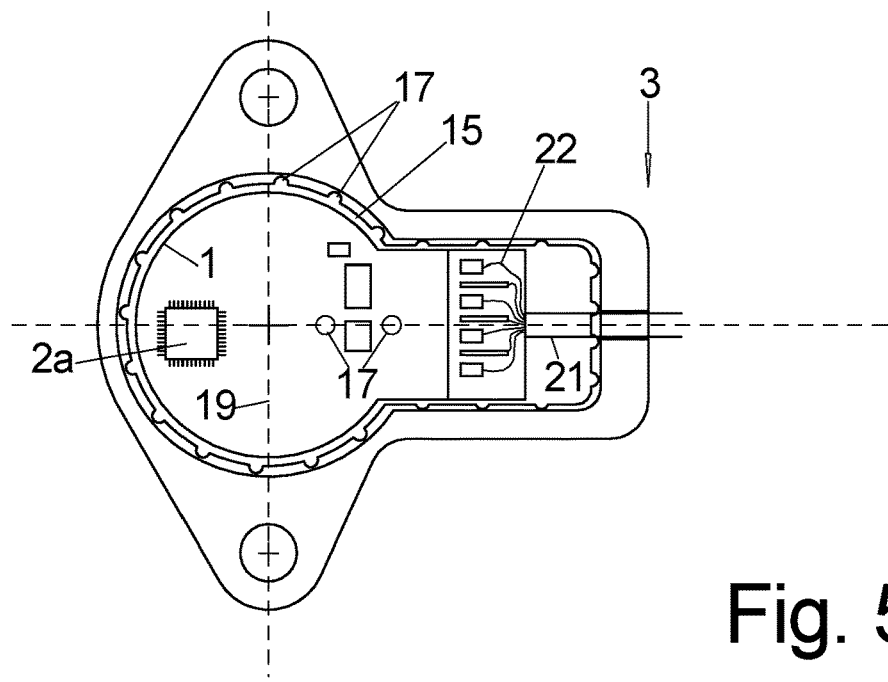
Figure 6:
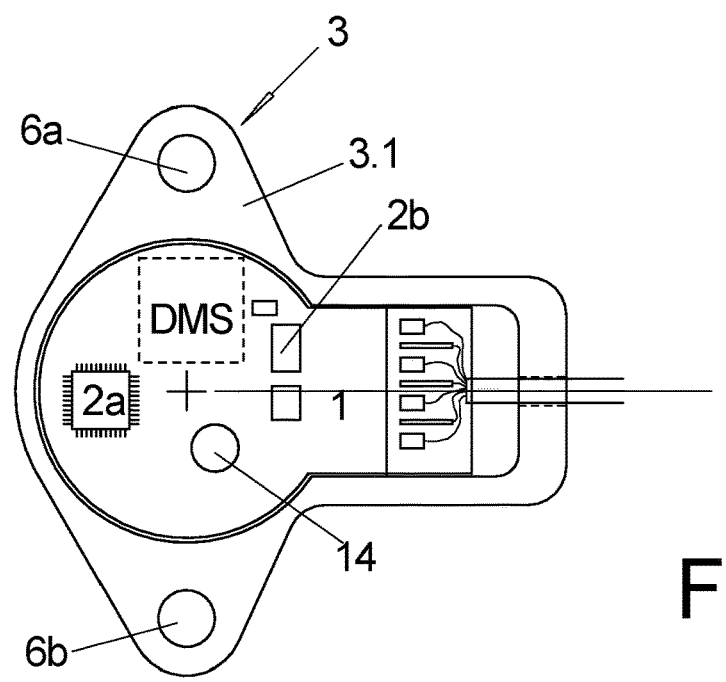

FIG. 2a, b illustrates the electronic circuit board in a top view and in a side view;

FIG. 3a, b illustrates the housing that is configured with the electronic circuit board and encased in a top view and in a side view;

FIG. 4 illustrates a second embodiment of the housing in the top view;

FIG. 5a, b illustrates the housing according to FIG. 1a, b with an inserted encasement element which includes the electronic circuit board; and FIG. 6 illustrates the sensor according to FIG. 2b including additional components.

In FIGS. 1a, b the tub shaped housing 3 in a first embodiment is initially illustrated by itself.

The housing 3a from whose circumferential edges side walls 3b protrude in an upward direction and form a recess 4 that is open towards a front side 3.1 and thus defined by a base surface 4.1 and a circumferential side surface 4.2.

Thus, the housing 3 can be made in a very simple manner from a plate shaped raw material from which an outer contour of the housing 3 is cut out and the recess 4 is milled out.

Thus the housing 3 has a flat front surface 3.1 in which an open side of the recess 4 extends and a base side 3.2 which extend parallel to each other and the later defines the main plane 3' of the housing 3.

In a top view of the base 3a of the housing according to FIG. 1a, thus the orthogonal 10 the recess 4 is shaped as a key hole, thus with a widest portion 4a configured as a circular segment extending over more than 270° and a narrower extension portion adjoining thereto in a direction.

The recess 4 as well as the entire housing 3 is configured lateral symmetrical thus mirror symmetrical to a symmetry plane 11' which is orthogonal to the main plane 3'.

On both sides of the widest portion 4a of the recess 4 the side walls 3b are widened and form attachment eyelets 5 through which a respective pass through opening 6a, 6b extends respectively from a front side 3.1 to a back side 3.2 wherein the pass through opening has a predetermined diameter d.

Figure 1B:
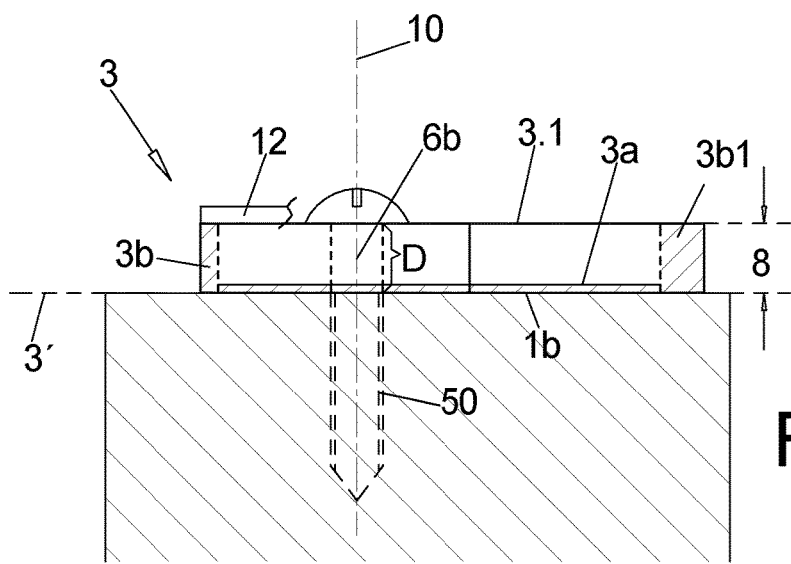
Figure 1C:
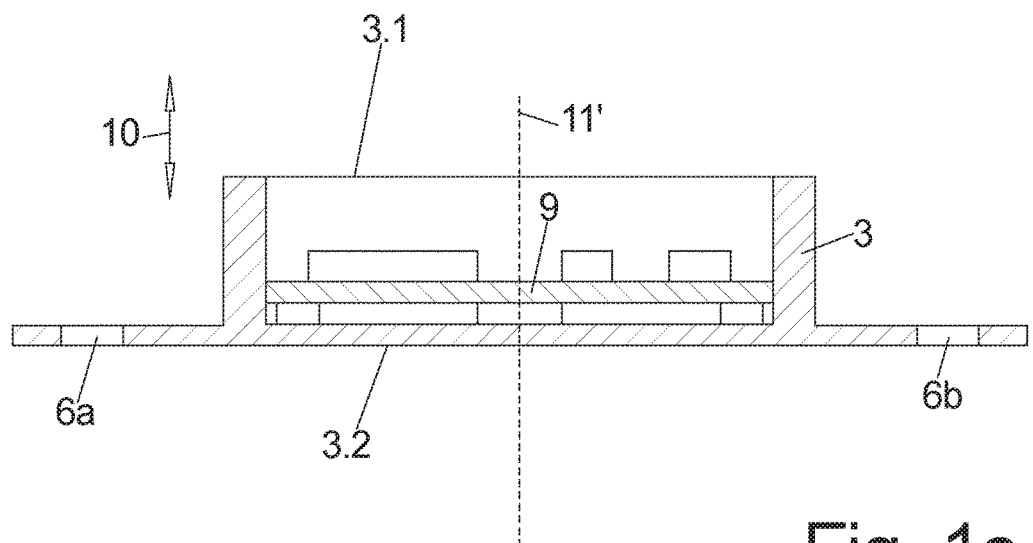

According to FIG. 1b the attachment eyelets 5 in the first variant of the first embodiment have the same thickness in the orthogonal direction as the wall height 8 as the side walls 3b that have the same height everywhere, in the second variant of the first embodiment according to FIG. 1c a much smaller thickness, but in both cases the attachment eyelets 5 are configured integral in one piece together with the top shaped housing body 3*.

The pass through openings 6a, b are used for bolting the complete sensor to an adjacent component using a bolt 50 that is inserted through the pass through opening 6a, b as illustrate din FIG. 1b. The two pass through openings 6a, b are arranged at a defined hole spacing 18 from center 6' to center 6' of the pass through openings 6a, b, wherein only two pass through openings are provided in this embodiment.

When more than two pass through openings 6a, b are provided the hole spacing 18 that is relevant for the bending load of the bolted down housing is the greatest distance between two of the more than two provided pass through openings 6a, b.

In the side wall 3b of the housing which sidewall extends parallel to a free end of the protrusion portion of the recess 4 there is furthermore a pass through opening 16 configured as a cable opening through which a cable 21 can be inserted into the housing 3 in order to provide a connection to the electronic circuit board 1 to be arranged in the housing 3 according to FIGS. 3a, b.

The electronic circuit board 1 is initially separately illustrated in FIGS. 2a, b. The electronic circuit board 1 carries in this case components 2a, b, c of an electronic circuit 2 on the top side 1a as well as on the bottom side 1b, below that the sensor element which is typically also configured as an electronic component.

In the top view 2a the electronic circuit board 1 has about the same shape as the recess 4 in top view, thus approximately the shape of a keyhole, but with a shorter protrusion portion 4b.

Furthermore the electronic circuit board 1 has at least three, in this case four protrusions 1c that project outward beyond the normal circumferential contour, wherein the protrusions are sized so that they contact the exactly at a side surface 4.2 in a condition where they are inserted into the housing 3.

At a top side 1a of the electronic circuit board 1 plural soldering pads 24 are arranged proximal to a free end of the protrusion portion, wherein the circuit on the electronic circuit board 1 can be soldered to the soldering pads 24 with strands of a cable 21 that is run through the cable opening 16 into the housing 3.

With respect to height, thus the vertical 10 the electronic circuit board is often positioned in the recess 4 in that the circuit board 1 contacts contact surfaces 3c that are provided in the housing 3 for this purpose. The contact surfaces 3c are either above a level of the base surface 4.1 of the recess 4 and protrude either from the base surface 4.1 or/and protrude inward from the inner surfaces 4.2 as illustrated e.g. in FIG. 1d.

However, the electronic circuit board 1 can also contact alternatively with the components provided on a bottom side of the circuit board, e.g. the components 2c on a base 3a of the housing.

After inserting the electronic circuit board 1 into the housing 3, inserting the cable 21 through the face side cable opening 16 of the sidewall 3b into the interior 4' of the recess 4 of the housing 3 and connecting, thus typically soldering its strands 22 with the soldering pads 24, the recess 4 of the housing 3 is encased with an encasement compound 9 up to a top edge of the sidewalls 3b, so that an encasement element 15 is provided after hardening the encasement compound 9, wherein the encasement element fills the recess 4 completely and is glued to the base 3a and to the insides of the sidewalls 3b. Namely because of the gap 23 remote from the protrusions 1c which gap is provided between an outer edge of the electronic circuit board 1 and an inner circumference of the recess 4 the encasement compound 9 can also flow under the electronic circuit board 1.

As stated supra it is essential for the configuration of the housing 3 that the tub shaped housing 3 is sized with respect to material selection, configuration and thickness of its sidewalls 3b and optionally additional factors like e.g. thickness of the base 3a as a function of the hole spacing 18 of the pass through openings 16a, b and their diameter d, so that a maximum force that is induced by bolting the housing 3 or the finished sensor to an adjacent component in combination with the provided lever arms does not suffice to bend the housing 3, in particular to bend it out of its main plane 3'.

FIG. 4 illustrates two additional embodiments of the housing 3 with the goal to reduce the hole spacing 18 between the pass through openings 6a, b and thus reduce a maximum lever arm.

In the embodiment illustrated in top view in FIG. 4 in the left half the shape of the hosing 3 differs and thus also the shape of the recess 4 in an interior of the housing, in that the pass through openings 6a, b out of which only the pass through opening 6a is illustrated in the left half, are not arranged in the portion of the recess 4 but in a portion of its smallest width, thus in the protrusion portion 4b or in a transition portion between the widest portion 4a, 4b remote from the recess 4.

It is an object to move the pass through opening 6a as close as possible to a longitudinal center of the housing 3 and thus to minimize leverage of the forces created by bolting.

This is implemented even better in the solution according to FIG. 4, right side.

Thus, the protrusion portion 4b has an indentation towards a longitudinal center 11, so that the recess 4 includes another location with minimum width within the protrusion portion 4b, wherein this minimum width is smaller than the protrusion portion 4b at the free end where strands of a cable run into the housing has to be performed on the circuit board.

In the portion of the inward indentation the right pass through opening 6b in this embodiment can be moved further in a direction towards the longitudinal center 11, so that only the required minimum wall thickness is provided between the pass through opening 6b and the recess 4.

As illustrated below the housing 3 this further minimizes the hole spacing 18 compared to the solution on the left half of FIG. 4 and certainly even more so relative to the embodiment of FIGS. 1a, b.

FIGS. 5a, b illustrate a solution where the electronic circuit board 1 and the electronic circuit 2 arranged thereon are not encased resting in the recess 4, but outside of the housing 3 in a non-illustrated encasement mold, certainly with cables 21 that are already connected to the electronic circuit board 1 and the electronic circuit 2.

This provides an encasement element 15 which includes protrusions 17 on its outside, wherein the encasement element 15 is sized so that it only contacts the inner circumference of the recess 4 with the protrusions 17, wherein an open top side of the protrusion 4 is closed tight by a cover 12 indicated in FIG. 1b.

Figure 5B:
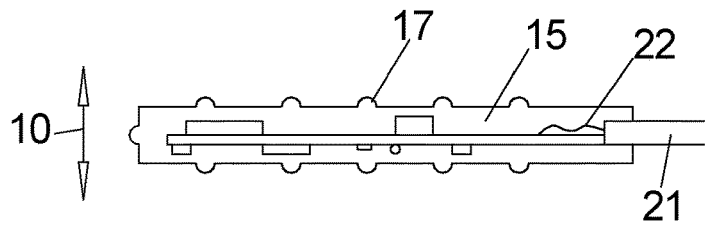

In a top view according to FIG. 5a the protrusions 17 can be arranged at circumferential sides of the encasement element 15, and/or on a top side and/or bottom side of the encasement element 15 as evident from the side view of FIG. 5b.

FIG. 6 illustrates the housing 3 according to FIG. 2b, thus with the electronic circuit board 1 inserted, with the addition that a strain gauge is arranged at the housing 3, in this case under the electronic circuit board 1 on a base 3a, wherein the strain gauge measures the bending load at this location of the housing and transmits the bending load measurement through an electrical connection to the circuit 2 on the electronic circuit board 1.

The electronic circuit determines whether the bending load of the housing 3 and thus of the entire sensor is below a predetermined acceptable threshold value, and if not, a warning signal is transmitted to an operator by the electronic circuit.

The warning signal can be for example an illumination of an LED 14 applied to a top side of the electronic circuit, wherein the LED is visible for the operator when a transparent encasement compound is used and indicates excessive bending load of the sensor.

The warning signal be for example an illumination of a LED 14 arranged on the top side of the electronic circuit board which is visible for an operator when using a transparent encasement compound 9 and which indicates excessive mechanical loading of the sensor.

Figure 1D:
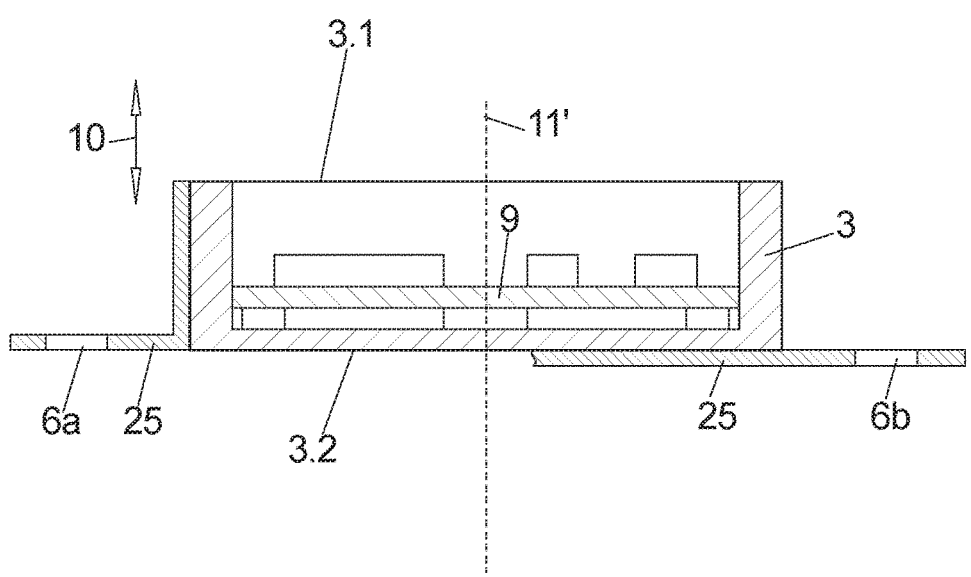

FIG. 1d shows a third embodiment where the attachment eyes 5 are fixation elements that are separate from the tub shaped housing body 3* and subsequently attached thereto, in particular bolted down or glued down.

It is illustrated in the right half of FIG. 1d that only one fixation component in the form of a fixation plate 25 is provided, wherein the fixation passes below a bottom side of the housing body 3* and is e.g. bolted together with the housing body 3*.

In the left half of the figure it is illustrated that a proprietary fixation element 25 is provided for each pass through opening 6a, b, wherein the proprietary fixation element contacts an outside of the housing body 3* with an arm of the proprietary fixation element and wherein a bottom side of another arm of the proprietary fixation element is aligned with a bottom side of the housing body 3*.

In both embodiments the force generated when bolting down the one or plural fixation elements can bend this fixation element 25, but the type of attachment at the housing body 3 as well as the configuration of the fixation element 25 can be selected so that a deformation of the interior space 4' of the recess 4 of the housing body 3 does not occur.

However, it is a disadvantage that the connection between the attachment component 25 and the housing body 3 can tear off completely.

REFERENCE NUMERALS AND DESIGNATIONS 1 electronic circuit board
1a top side
1b bottom side
1c protrusion
2 circuit
2a, b element
3 housing
3.1 front side
3.2 base side
3* main plane
3a base
3b side wall
3b1 face wall
3* housing body
3c contact surface
4 recess
4' inner space
4.1 base surface
4.2 side surface
4a widest portion
4b protrusion portion
5 attachment eyelet
6a, b pass through opening
6' center point
7 wall thickness
8 wall height
9 encasement compound
10 axial direction, orthogonal, vertical
11 longitudinal center 11' symmetry plane
12 cover
13 cable
14 LED
15 encasement element
16 cable opening
17 protrusion
18 hole spacing
19 connection line
20 orthogonal
21 cable
22 strand
23 spacing
24 soldering pads
25 fixation element
50 bolt
D thickness (of 5)
DMS strain gauge
D diameter (of 6a, b)
F Force

The invention claimed is:

1. A sensor, comprising:
a tub shaped housing (3) integral in one piece besides an optionally provided cover (12),
an electronic circuit board (1) with an electronic circuit with electronic components (2a, b) arranged thereon,
a recess (4) that is open towards a front side (3.1) for receiving the electronic circuit board (1) formed by a base surface (4.1) and a side surface (4.2) that extends in a circumferential direction along the walls of the base surface (4.1),
wherein the housing (3) includes a flat, outer backside (3.2) which defines a main plane (3') of the housing (3),
wherein at least one of at least two pass through openings (6a, b) extends respectively remote from the recess (4) transversal to the main plane (3') through an attachment eyelet of the housing (3),
characterized in that
a diameter (d) of the pass through openings (6a, b) only has a maximum diameter so that
an interior space (4') of the recess (4) does not deform when the housing (3) contacts an uneven contact surface with a backside (3.2) of the housing (3), when
a respective force (F) is applied at the housing (3) in a center of the pass through openings (6a, b) in a direction transversal to the main plane (3'), wherein the respective force is greater than a maximum tensile strength of a bolt (50) that is insertable through the respective pass though opening (6a, b) with a close fit.

2. The sensor according to claim 1, characterized in that the front side (3.1) is arranged parallel to the flat backside (3.2) and the circumferential side walls (3b) have identical wall height (8) everywhere.

3. The sensor according to claim 1, characterized in that the interior space (4') does not deform transversal to its main plane (3').

4. The sensor according to claim 1, characterized in that the diameter (d) of the pass through openings (6a, b) is predetermined as a function of a material and dimensions of the housing (3) relative to the wall thickness (7) and a wall height (8).

5. The sensor according to claim 1, characterized in that a thickness (D) of the attachment eyelets (5) is more than 60% of a height (8) of the circumferential side walls (3b), so that the attachment eyelets (5) do not deform when the housing (3) contacts an uneven contact surface with a backside (3.2) of the housing (3), when
a respective force (F) is applied at the housing (3) in a center of the pass through openings (6a, b) in a direction transversal to the main plane (3'), wherein the respective force is greater than a maximum tensile strength of a bolt (50) that is insertable through the respective pass though opening (6a, b) with a close fit.

6. The sensor according to claim 1, characterized in that a thickness (D) of the attachment eyelets (5) is less than 50% of a height (8) of the circumferential side walls (3b), so that the attachment eyelets (5) do deform when the housing (3) contacts an uneven contact surface with a backside (3.2) of the housing (3), when
a respective force (F) is applied at the housing (3) in a center of the pass through openings (6a, b) in a direction transversal to the main plane (3'), wherein the respective force is smaller than or equal to a maximum tensile strength of a bolt (50) that is insertable through the respective pass though opening (6a, b) with a close fit.

7. A sensor, comprising:
a shaped housing (3) including
a tub shaped housing body (3')
at least one fixation element attached at the housing body and configured to fixate the housing body (3') at an adjacent component,
an optional provided cover (12) configured to close the housing body (3'),
an electronic circuit board (1) with an electronic circuit with electronic components (22) arranged thereon,
a recess (4) in the housing body (3*) that is open towards a front side (3.1) for receiving the electronic circuit board (1) formed by a base surface (4.1) and a side surface (4.2) that extends in a circumferential direction along the walls of the base surface (4.1),
wherein the fixation element extending below the housing includes a flat, outer backside (3.2) which defines a main plane (3') of the housing (3),
wherein at least one of at least two pass through openings extends respectively remote from the recess (4) transversal to the main plane (3') through the fixation element (25), characterized in that
a diameter (d) of the pass through openings (6a, b) only has a maximum diameter so that
an interior space (4') of the recess (4) does not deform when the housing (3) contacts an uneven contact surface with a backside (3.2) of the housing (3), when
a respective force (F) is applied in a center of the pass through openings (6a, b) in a direction transversal to the main plane (3') at the housing (3), wherein the respective force is greater than a maximum tensile strength of a bolt (50) that is insertable through the respective pass though opening (6a, b) with a close fit.

8. The sensor according to claim 7, characterized in that the circumferential sidewalls (3b) are arranged perpendicular to the backside (3.2).

9. The sensor according to claim 7, characterized in that in top view, in an orthogonal direction (10) of the main plane (3) the recess (4) has a non-circular contour and the electronic circuit board (1) has at least the same non circular contour and the electronic circuit board (1) contacts the side walls of the recess (4) at least at three points where the electronic circuit board is inserted into the recess (4).

10. The sensor according to claim 7, characterized in that a widest portion (4a) of the recess (4) is arranged between the pass through openings (6a, b) and a protrusion portion (4b) with less width adjoins in the main plane (3') at the widest portion.

11. The sensor according to claim 7, characterized in that
the recess (4) is center symmetrical to a symmetry plane (11') that extends perpendicular to the main plane (3), wherein also a direction of a largest extension of the recess (4) is arranged in the main plane (3'), and arranged in the symmetry plane (11'), and
the recess (4) has a key hole shaped contour in a top view with a widest portion (4a) configured as a circular segment extending over more than 270° and a narrower protrusion portion (4b) adjoining thereto in a direction.

12. The sensor according to claim 7, characterized in that
either the electronic circuit board (1) sits on contact surfaces (3c) of the housing (3) that are offset from the base surface (4.1),
or the electronic circuit board contacts the base surface (4.1) with components (2a, b) protruding from a bottom side of the electronic circuit board (1), and
the electronic circuit board rests in the recess (4) parallel to a base (3a) and/or the front side (3.1) and/or the backside (3.2) of the housing (3).

13. The sensor according to claim 7, characterized in that
the electronic circuit board (1) has a distance (23) from the side surface (4.2) of the recess (4) at least at two circumferential locations in order to allow an encasement compound to flow through, and/or
the open front side (3.1) of the housing (3) is closed by a cover (12) that is glued or bolted to the housing (3).

14. The sensor according to claim 7, characterized in that
the electronic circuit board (1) is completely enclosed in the recess (4) by an encasement compound that fills the recess (4) at least partially, and/or
the electronic circuit board (1) is received in an encasement element (15) made from a cured encasement compound, wherein the encasement element (15) has protrusions (17) at its outside which protrusions are cone shaped or bar shaped, wherein the encasement element (15) contacts the housing (3) with the protrusions (17) in an inserted condition of the encasement element (15).

15. The sensor according to claim 14, characterized in that the encasement element (15) includes protrusions (17) that protrude in a direction transversal to the main plane (3'), wherein the protrusions are arranged exclusively on a perpendicular (20) to the connection line (19') between two pass through openings (6a, b) on the encasement element (15).

16. The sensor according to claim 10, characterized in that a pass through opening (16) with an internal thread is arranged in a face wall (3b1) of the protrusion portion (4b), wherein the pass through opening forms a cable outlet, and
the electronic circuit board (1) terminates at a distance from the face wall (3b1) in an inserted condition of the electronic circuit board and the electronic circuit board includes attachment devices for attaching strands of a cable (13) that runs out of the housing (3).

17. The sensor according to claim 16, characterized in that a wall thickness (7) of the face wall (3b1) of the protrusion portion (4b) is greater than a wall thickness of adjacent sidewalls (3b) extending at an angle to the face wall (3b1), greater by a factor of 1.5.

18. The sensor according to claim 7, characterized in that the sidewalls (4b) do not undercut a minimum wall thickness (7) and also a distance (18) measured in the main plane (3') between the recess (4) and the pass through openings (6a, b) is greater than the minimum wall thickness (7) and the minimum wall thickness (7) is at least 10% of a height (8) of the sidewalls (3b).

19. The sensor according to claim 7, characterized in that a height (8) of the sidewalls (3b) is at least 12% of a hole spacing (18) between the two pass through openings (6a, b) that are spaced the most from each other measured along a connection line (19) from a center point (6') to a center point (6').

20. The sensor according to claim 7, characterized in that a thickness of a base (3a) of the housing (3) corresponds at the most to a minimum wall thickness (7) of the side walls (3b) of the housing (3).

21. The sensor according to claim 7, characterized in that
a strain gauge (DMS) is arranged at the housing (3), at a base (3a) of the housing (3) at an outside and/or at an inside, wherein the strain gauge is connected with the electronic circuit (2) on the electronic circuit board (1), and
a LED (14) or plural LEDs (14) are arranged on a side of the electronic circuit board (1) that is oriented towards the front side (la), wherein the LEDs indicate by illumination or non-illumination whether a mechanical tension of the housing measured by the strain gauge (DMS) is within or outside of a permissible range.

22. The sensor according to claim 7, characterized in that three LEDs (14) with colors green, yellow, and red are provided and the encasement compound (9) is at least partially transparent.

23. The sensor according to claim 7, characterized in that the pass through openings (6a, b) are arranged opposite to each other remote from the recess (4) at a distance (18) from the recess (4), wherein the recess (4) includes a contraction towards a longitudinal center (11) in a transition portion between a widest portion (4a) and a protrusion portion (4b) of the recess (4) and the pass through openings (6a, b) are arranged in an axial portion of the contraction.

24. The sensor according to claim 7, characterized in that the pass through openings (6a, b) are arranged in a portion of a smallest width of the recess (4) outside of the recess (4) and without a connection to the recess (4) and opposite to each other with respect to the recess (4).

25. The sensor according to claim 7, characterized in that, the at least one fixation element is attached in such way to the housing body, that the fixation element does deform when the housing (3) contacts an uneven contact surface with a backside (3.2) of the housing (3), when
a respective force (F) is applied at the housing (3) in a center of the pass through openings (6a, b) in a direction transversal to the main plane (3'), wherein the respective force is smaller than or equal to a maximum tensile strength of a bolt (50) that is insertable through the respective pass though opening (6a, b) with a close fit.

26. The sensor according to claim 11, characterized in that the widest portion (4a) of the recess (4) is arranged between the pass through openings (6a, b).

27. The sensor according to claim 11, characterized in that the protrusion portion (4b) of the recess (4) is arranged between the pass through openings (6a, b).

28. The sensor according to claim 11, characterized in that the recess comprises a contraction between the widest portion (4a) and the protrusion portion (4b) which is narrower than the protrusion portion, wherein the contraction is arranged between the pass through openings (6a, b).

* * * * *